US008891569B2

(12) United States Patent
Gerlach

(10) Patent No.: US 8,891,569 B2
(45) Date of Patent: Nov. 18, 2014

(54) VCSEL ARRAY WITH INCREASED EFFICIENCY

(75) Inventor: Philipp Henning Gerlach, Eindhoven (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/003,818

(22) PCT Filed: Mar. 2, 2012

(86) PCT No.: PCT/IB2012/051003
§ 371 (c)(1),
(2), (4) Date: Sep. 9, 2013

(87) PCT Pub. No.: WO2012/120426
PCT Pub. Date: Sep. 13, 2012

(65) Prior Publication Data
US 2013/0343418 A1    Dec. 26, 2013

(30) Foreign Application Priority Data

Mar. 9, 2011 (EP) .................................. 11157527

(51) Int. Cl.
*H01S 5/00* (2006.01)
*H01S 5/42* (2006.01)
*H01S 5/183* (2006.01)
*H01S 5/02* (2006.01)
*H01S 5/20* (2006.01)

(52) U.S. Cl.
CPC .............. *H01S 5/423* (2013.01); *H01S 5/18361* (2013.01); *H01S 5/0207* (2013.01); *H01S 5/18311* (2013.01); *H01S 5/18341* (2013.01); *H01S 5/2081* (2013.01); *H01S 5/18369* (2013.01); *H01S 5/18344* (2013.01)
USPC .................. 372/45.01; 372/43.01; 372/44.01; 372/46.01; 372/50.12; 372/50.124

(58) Field of Classification Search
USPC ........... 372/43.01, 44.01, 45.01, 46.01, 50.12
See application file for complete search history.

(56) References Cited

U.S. PATENT DOCUMENTS 5,882,948 A * 3/1999 Jewell ............................ 438/22
6,507,595 B1    1/2003 Kapon
(Continued)

FOREIGN PATENT DOCUMENTS

| EP | 1030420 A1 | 8/2000 |
| EP | 1511138 A1 | 3/2005 |
| EP | 2107653 A2 | 7/2009 |

OTHER PUBLICATIONS

Bashir Barbar, "Designing of High Reflectance Distributed Bragg Reflectors (DBRs), Mirrors using AlGaInN Material System in the UV Wavelength Range", University of Gavle, Supelec, Dept. of Technology and Built Environment, Jun. 2009.

(Continued)

*Primary Examiner* — Dung Nguyen
(74) *Attorney, Agent, or Firm* — Larry Liberchuk

(57) ABSTRACT

The present invention relates to a VCSEL array comprising several VCSELs arranged side by side on a common substrate (1). Each VCSEL is formed of at least a top mirror (5, 14), an active region (4), a current injection layer (3) and an undoped bottom semiconductor mirror (2). The current injection layer (3) is arranged between the active region (4) and the bottom semiconductor mirror (2). At least an upper layer of the substrate (1) is electrically conducting. Trenches (8) and/or holes are formed between the bottom semiconductor mirrors (2) of said VCSELs to said upper layer of said substrate (1). A metallization (9) electrically connects the upper layer of the substrate (1) with the current injection layer (3) through said trenches (8) and/or holes. The proposed VCSEL array allows a homogeneous current injection an has a high efficiency and power density.

7 Claims, 4 Drawing Sheets

(56) References Cited

U.S. PATENT DOCUMENTS

| | | | |
|---|---|---|---|
| 6,830,940 | B1 | 12/2004 | Wasserbauer |
| 6,876,687 | B2 | 4/2005 | Zhu |
| 2002/0025589 | A1 | 2/2002 | Hall |
| 2003/0031218 | A1 | 2/2003 | Yeh |
| 2010/0054290 | A1* | 3/2010 | Hatakeyama .................. 372/36 |

OTHER PUBLICATIONS

Mehta Manish, "High-Power, High-Bandwidth, High-Temperature Long-Wavelength Vertical-Cavity Surface-Emitting Lasers", University of California, Santa Barbara, Electrical and Computer Engineering, Jun. 2006.

Strijbos R.C. et al., "Current Crowding in Oxide-Confined Intracavity-Contacted VCSELs", Proceedings Symposium IEEE/LEOS Benelux Chapter, 2000, Delft, The Netherlands, pp. 223 to 226.

Volodymyr Lysak et al., "Integrated High Speed VCSELs for Bi-Directional Optical Interconnects", NUSOD 2006, Sep. 1-14, 2006 /NanyangTechnological University, Singapore, Gwangju Institute of Science and Technology.

Zhang Z. et al., "Optical Loss and Interface Morphology in AlGaAs/GaAs Distributed Bragg Reflectors", Applied Physics Letters, Sep. 2007, lett. 91, Issue 10, Department of Microelectronics and Applied Physics, Royal Institute of Technology (KTH), Electrum 229, S-164 40 Kista, Sweden.

* cited by examiner

VCSEL ARRAY WITH INCREASED EFFICIENCY

FIELD OF THE INVENTION

The present invention relates to an array comprising several vertical cavity surface emitting lasers (VCSEL) arranged side by side on a common substrate, each VCSEL being formed of at least a top mirror, an active region, a current injection layer and an undoped bottom semiconductor mirror, said current injection layer being arranged between said active region and said bottom semiconductor mirror. Such a VCSEL array can be used in applications requiring semiconductor light sources with high power density, for example in lighting applications.

BACKGROUND OF THE INVENTION

High efficient VCSELs require highly reflective semiconductor mirrors, typically realised as distributed Bragg reflectors (DBR). Doped DBRs show a higher absorption of the generated laser light than undoped DBRs. Therefore, for high efficient VCSEL designs the use of undoped DBRs is preferred.

R. C. Strijbos et al., "Current crowding in oxide-confined intracavity-contacted VCSELs", Proceedings Symposium IEEE/LEOS Benelux Chapter, 2000, Delft, The Netherlands, pages 223 to 226 disclose such a top-emitting VCSEL with undoped DBRs. On both sides of the active region contact layers are formed to which a metallization is applied in order to electrically contact the contact layers from the top side.

High power VCSEL array designs, consisting of multiple single VCSEL light sources, need to take care of homogeneous carrier injection. This means that all single VCSELs in a VCSEL array typically get the same operation current and that a voltage drop over the electrical lines of the array must be avoided. In case of a state of the art top-emitting VCSEL array, a highly conductive substrate is used for the homogeneous n-current injection and a thick, usually plated, gold layer is used for homogeneous p-carrier-injection. This requires an electrically conducting (doped) bottom DBR, which then on the other hand has an increased absorption for the laser light and thus lowers the efficiency of the VCSELs.

SUMMARY OF THE INVENTION

It is an object of the present invention to provide a top-emitting VCSEL array, which comprises VCSELs with undoped semiconductor mirrors between the active region and the substrate an which nevertheless the allows a homogenous carrier injection.

The object is achieved with the VCSEL array according to claim 1. Advantageous embodiments of this VCSEL array are subject matter of the dependent claims or are described in the subsequent portions of the description and embodiments.

The proposed VCSEL array comprises several VCSELs arranged side by side on a common substrate. Each VCSEL is formed of at least a top mirror, an active region, a current injection layer and an undoped bottom semiconductor mirror, in particular a DBR, said current injection layer being arranged between the active region and the bottom semiconductor mirror. The top mirror may be e.g. a semiconductor mirror, in particular a DBR, or a dielectric mirror. The terms top and bottom are used in the common way to show the position of the corresponding layers or mirrors relative to the substrate. The bottom mirror is thus arranged closer to the substrate than the top mirror. A top emitting VCSEL means that the generated laser radiation is emitted through the top mirror and not through the bottom mirror and substrate. The terms top and bottom thus do not indicate the spatial orientation of the VCSEL array.

In the proposed VCSEL array at least an upper layer of the substrate is electrically conducting. Trenches and/or holes are formed between the bottom semiconductor mirrors of the VCSELs to the upper layer of the substrate. A metallization (i.e. metal contacts or a metal layer) electrically connects the upper layer of the substrate with the current injection layer through said trenches and/or holes.

With this measure, the substrate still can be used for carrier injection into the active region although an undoped semiconductor mirror is arranged between the substrate and the active region. The proposed VCSEL array thus allows a homogeneous current injection and at the same time has a high efficiency and high power density.

The metallizations used for the connection between the upper layer of the substrate and the current injection layer—arranged between the lower semiconductor mirror and the active region—is preferably formed of an electrically highly conducting material like gold. The same applies to the metallization at the top side of the active region. The present invention uses the remaining substrate area or chip area between the single VCSELs to connect the upper conductive layer of the substrate with the bottom current injection layer. The required holes or trenches between the single VCSELs can be generated by an appropriate etching process after the fabrication of the single VCSELs or at least after fabrication of the the bottom layers of these VCSELs on the substrate.

The substrate is preferably a semiconductor substrate, the upper layer of which is doped to achieve the desired electrical conductivity, for example n-doped with a doping concentration of $2.5 \times 10^{18}$ cm$^{-3}$. The doping of the upper layer of the substrate preferably extends continuously over the whole area on which the VCSELs are arranged. Instead of the upper layer of the substrate also the whole substrate may be doped appropriately (see above) in order to achieve the desired electrical conductivity.

In a preferred embodiment of the present invention the single VCSELs are provided with an n-doped carrier injection layer between the bottom semiconductor mirror and the active region and an n-doped upper layer of the substrate. The top mirror may then be, for example, a dielectric mirror or a p-doped DBR which is contacted through p-contacts.

BRIEF DESCRIPTION OF THE DRAWINGS

These and other aspects of the invention will be apparent from and elucidated with reference to the embodiments described hereinafter. In the drawings.

DETAILED DESCRIPTION OF EMBODIMENTS

The figures show an example for fabricating a VCSEL array according to the present invention. In the figures, only a part of the array with two single VCSELs is shown. It is clear that the complete array as a higher number of VCSELs which are fabricated with the same process steps at the same time.

Figure 1:
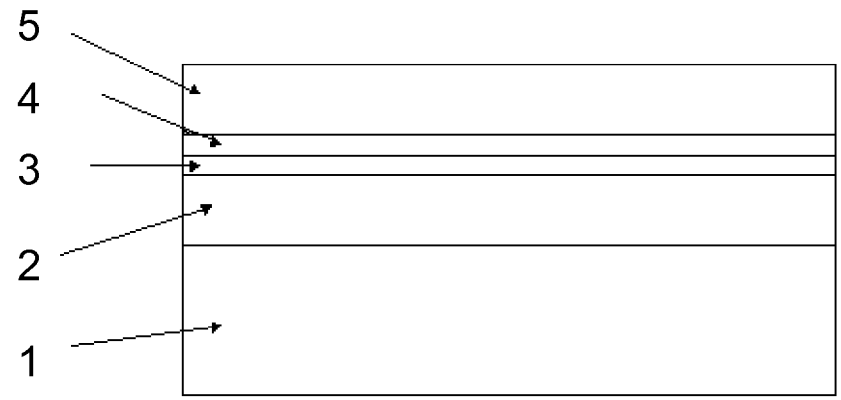
FIG. 1 schematically shows a first stage in the fabrication of a VCSEL array according to the invention.

The VCSELs of the proposed array can be fabricated in the known manner by epitaxially growing a layer stack on a carrier substrate or wafer. FIG. 1 shows an example for such an epitaxial layer stack comprising an undoped DBR 2, a n-doped current injection layer 3, an active layer 4 and a p-doped DBR 5 on the top side. The materials for the single layers as well as the configuration of the DBRs and the active layer can be chosen as already known in the art.

Figure 2:
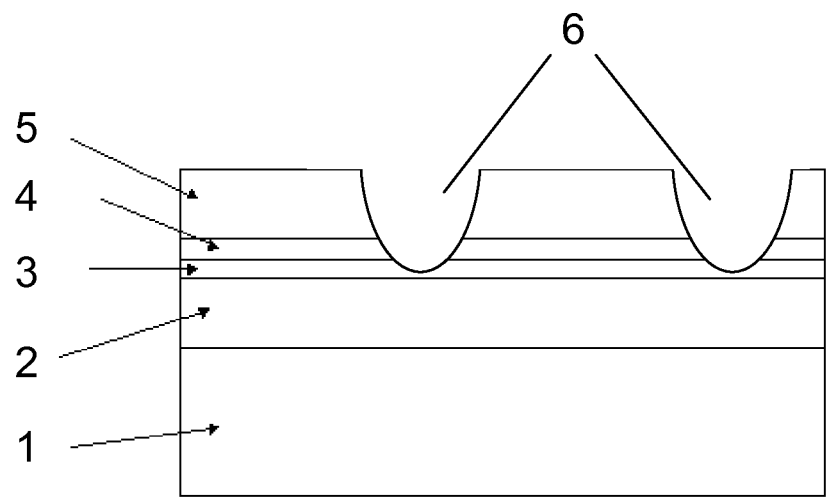
FIG. 2 schematically shows a second stage in the fabrication of a VCSEL array according to the invention.
Figure 3:
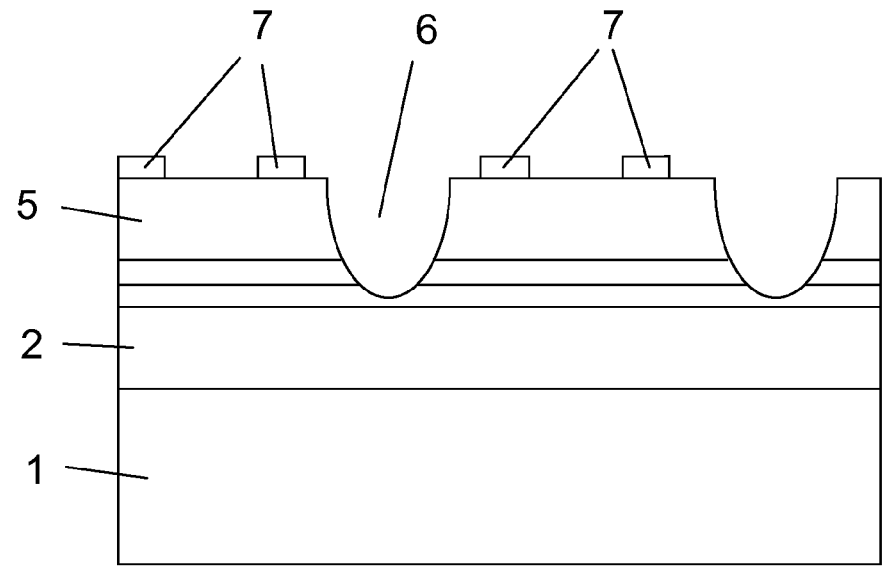
FIG. 3 schematically shows a third stage in the fabrication of a VCSEL array according to the invention.

The epitaxial layer stack of FIG. 1 is then subjected to a wet chemical etch at the wafer areas that will later serve as electrical connections. The trenches 6 formed by this wet chemical etch are indicated in FIG. 2. The trenches may surround each VCSEL completely, which is however not necessary. In order to achieve a dense arrangement of the VCSELs it is also possible, for example, to arrange the VCSELs and trenches in a checkerboard-like design, such that the VCSELs occupy the white areas and the trenches the dark areas of the checkerboard. After this etching step p-contact rings 7 are formed at the top surface of the p-doped DBR 5. This metallization, commonly made of high electrically conducting materials, for example of Ti/Pt/Au for generating p-contacts on GaAs, is applied with known lithographic and depositing techniques. FIG. 3 shows the result after application of the p-contact rings 7.

Figure 4:
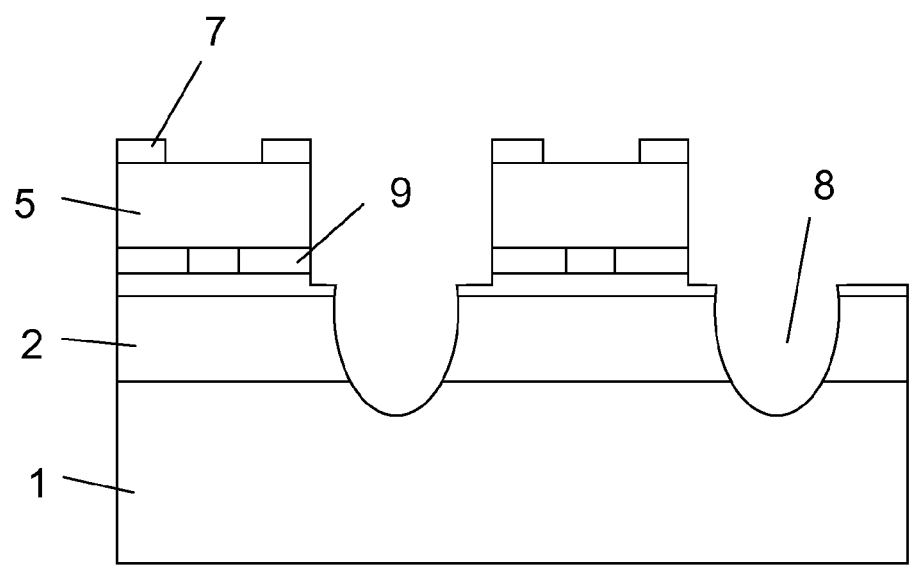
FIG. 4 schematically shows a fourth stage in the fabrication of a VCSEL array according to the invention.

A mesa etch and wet oxidation results in the configuration of FIG. 4. The p-contact ring 6 serves as the etch mask for the mesa etch during which the already existing trenches 6 are further deepened to form the trenches or holes 8 to the substrate 1. The active region 4 is laterally limited by oxidation layers 9, which are generated by the wet oxidation process.

Figure 5:
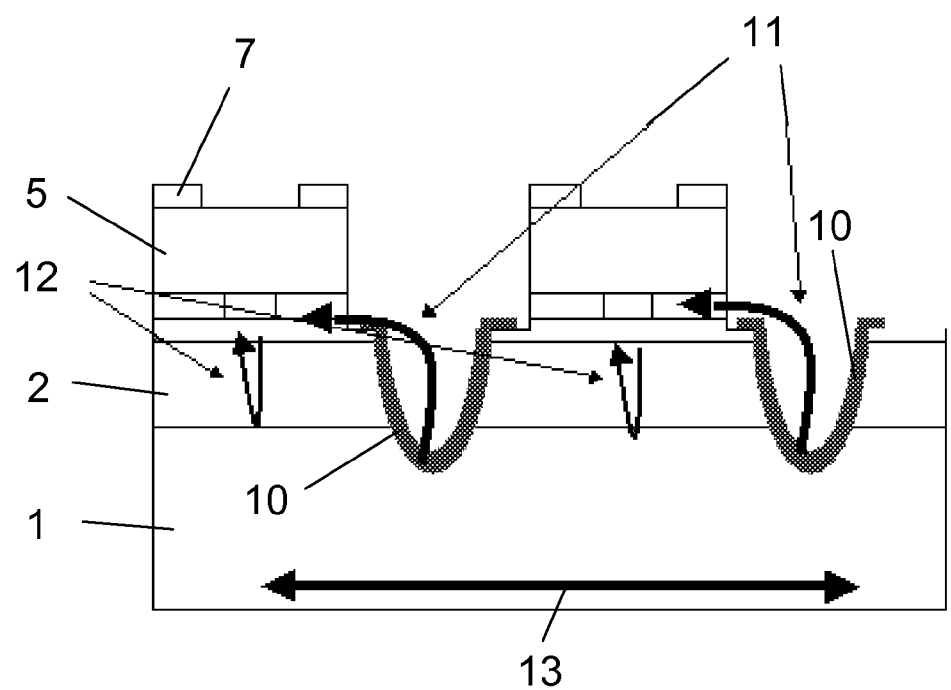
FIG. 5 schematically shows the final configuration of a part of the VCSEL array according to the invention.

FIG. 5 shows the final configuration after n-contact metal formation, for example of a metal sequence of Ge/Au/Ni/Au. With this metallization (n-contacts 10) an electrical connection is achieved between the substrate 1 and the individual current injection layers 3 of the VCSEL. The carriers are injected from the sides (carrier injection 11). The substrate 1 in this configuration still can be used for homogeneous carrier injection on the n-side although the lower DBR 2 is not electrically conducting. The electrical connection is achieved by removing the non conductive DBR portions between the single VCSELs and applying a metallization layer to connect the VCSELs n-electrode with the substrate. Since the substrate 1 serves as a good current spreading layer and the undoped DBR 2 has low optical loss, a VCSEL array with this configuration has a high efficiency and high power density.

Figure 6:
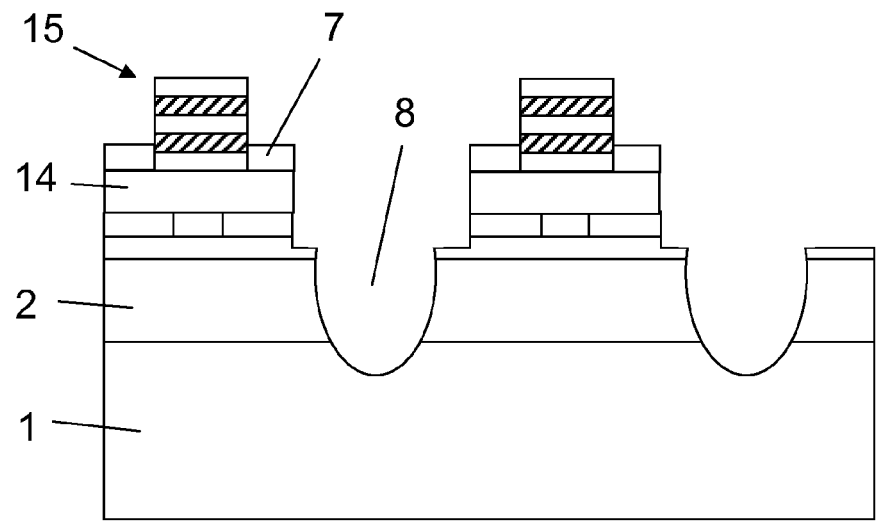
FIG. 6 schematically shows a fifth stage in the fabrication of a VCSEL array according to another embodiment with dielectric top mirrors.
Figure 7:
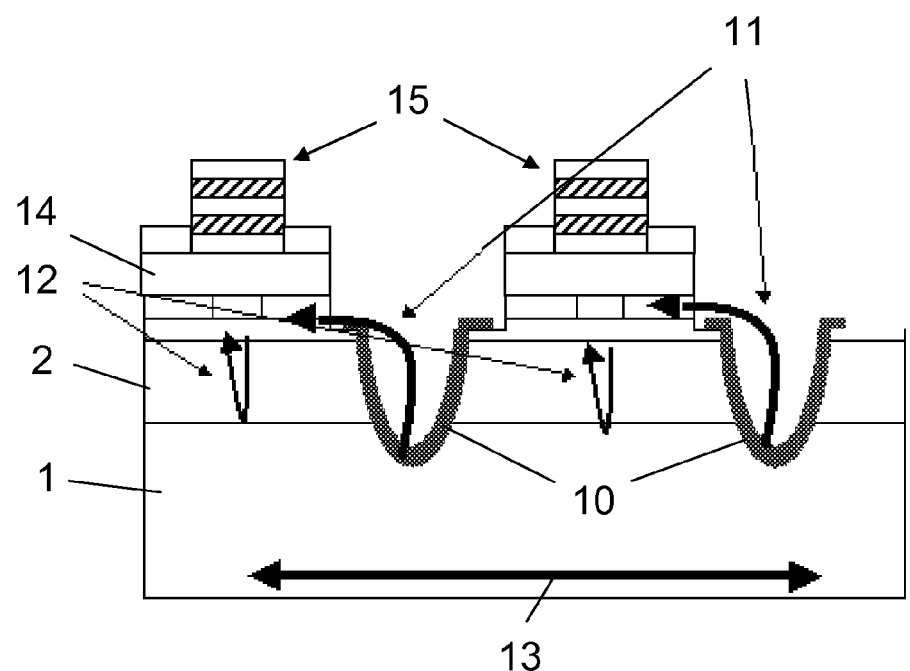
FIG. 7 schematically shows the final configuration of a part of the VCSEL array with dielectric top mirrors.

In case of fabricating a VCSEL array with dielectric top mirrors instead of DBRs, the epitaxial layer stack of FIG. 1 would comprise a p-doped semiconductor spacer layer 14 instead of the p-doped DBR 5 on the top side. After wet chemical etch like in FIG. 2, formation of p-contact rings 7 on the spacer layer 14 like in FIG. 3, mesa etch and wet oxidation like in FIG. 4, the dialectic top mirror 15 is deposited as shown in FIG. 6. FIG. 7 then shows the final configuration after n-contact metal formation similar to FIG. 5.

While the invention has been illustrated and described in detail in the drawings and forgoing description, such illustration and description are to be considered illustrative or exemplary and not restrictive; the invention is not limited to the disclosed embodiments. Other variations to the disclosed embodiments can be understood and effected by those skilled in the art in practising the claimed invention, from a study of the drawings, the disclosure, and the appended claims. In particular, the VCSELs of the proposed array may include further layers, for example also a p-doped current injection layer between the top DBR and the active region. Also the p-contacts may be arranged in a different manner. In the claims, the word "comprising" does not exclude other elements or steps, and the indefinite article "a" or "an" does not exclude a plurality. The mere fact that certain measures are recited in mutually different dependent claims does not indicate that a combination of these measures can not be used to advantage. The reference signs in the claims should not be construed as limiting the scope of the claims.

LIST OF REFERENCE SIGNS 1 n-doped substrate
2 undoped DBR
3 n-doped current injection layer
4 active region/layer
5 p-doped DBR
6 trenches
7 p-contact ring
8 trenches
9 oxidation layer
10 n-contact metallization
11 carrier injection
12 high optical reflection
13 high lateral conductivity
14 p-doped semiconductor spacer layer
15 dielectric top mirror

The invention claimed is:

1. A VCSEL array comprising several VCSELs arranged side by side on a common substrate, each VCSEL being formed of at least a top mirror, an active region, a current injection layer and an undoped bottom semiconductor mirror, said current injection layer being arranged between said active region and said bottom semiconductor mirror, wherein
   at least an upper layer of said substrate is electrically conducting,
   trenches and/or holes are formed between said bottom semiconductor mirrors of said VCSELs to said upper layer of said substrate, and
   a metallization electrically connects said upper layer of said substrate with said current injection layer through said trenches and/or holes.

2. The VCSEL array according to claim 1, wherein the substrate is a doped, electrically conducting semiconductor substrate.

3. The VCSEL array according to claim 1, wherein the substrate is a semiconductor substrate, said upper layer of which is doped.

4. The VCSEL array according to claim 1, wherein the top mirror is a doped or undoped distributed Bragg reflector.

5. The VCSEL array according to claim 1, wherein the top mirror is a dielectric mirror.

6. The VCSEL array according to claim 1, wherein the bottom semiconductor mirror is an undoped distributed Bragg reflector.

7. The VCSEL array according to claim 1, wherein the top mirror is a p-doped distributed Bragg reflector or dielectric mirror, the substrate is a n-doped semiconductor substrate or a semiconductor substrate with a n-doped upper layer, the current injection layer is n-doped and the bottom semiconductor mirror is an undoped distributed Bragg reflector.

\* \* \* \* \*